US009344095B2

(12) United States Patent
Hammes et al.

(10) Patent No.: US 9,344,095 B2
(45) Date of Patent: May 17, 2016

(54) TEMPERATURE COMPENSATION FOR AN OSCILLATOR CRYSTAL

(75) Inventors: Markus Hammes, Dinslaken (DE); Stefan Van Waasen, Xanten (DE); Dieter Quaschik, Moenchengladbach (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1187 days.

(21) Appl. No.: 12/697,285

(22) Filed: Jan. 31, 2010

(65) Prior Publication Data

US 2011/0187422 A1 Aug. 4, 2011

(51) Int. Cl.
H03L 1/02 (2006.01)
H03B 5/32 (2006.01)
H03L 7/18 (2006.01)

(52) U.S. Cl.
CPC *H03L 1/026* (2013.01); *H03B 5/32* (2013.01); *H03L 1/027* (2013.01); *H03L 7/18* (2013.01)

(58) Field of Classification Search
USPC .............................................. 331/66, 158, 176
See application file for complete search history.

(56) References Cited

U.S. PATENT DOCUMENTS 5,912,595 A * 6/1999 Ma et al. .................. 331/117 D
7,248,126 B2 * 7/2007 Kanbe .............................. 331/66

FOREIGN PATENT DOCUMENTS

DE 19640677 A1 4/1998

* cited by examiner

*Primary Examiner* — Ryan Johnson
(74) *Attorney, Agent, or Firm* — Schwegman Lundberg & Woessner, P.A.

(57) ABSTRACT

An electronic device is equipped with an oscillator interface to be coupled to an oscillator crystal of an oscillator element. The electronic device includes an oscillator circuit which is coupled to the oscillator interface and generates an oscillator signal. The electronic device is further provided with a temperature measurement interface to be coupled to a temperature sensor of the oscillator element so as to receive the temperature signal. For accomplishing temperature compensation, the electronic device is provided with a measurement controller coupled to the measurement interface and configured to measure a first value of the temperature signal at a first point of time and a second value of the temperature signal at a second point of time. A frequency drift estimator is provided so as to estimate a frequency drift of the oscillator signal on the basis of the first value of the temperature signal and a second value of the temperature signal. By means of a compensation logic, a frequency compensation signal for the oscillator circuit is generated on the basis of the estimated frequency drift.

25 Claims, 8 Drawing Sheets

TEMPERATURE COMPENSATION FOR AN OSCILLATOR CRYSTAL

FIELD OF THE INVENTION

The present invention relates to techniques of temperature compensation for an oscillator crystal.

BACKGROUND OF THE INVENTION

In electronic devices, it is known to use oscillator crystals for the purpose of generating an oscillator signal. For example, such an oscillator signal may be used as a basis for operating a radio frequency (RF) receiver, e.g. in a mobile communication system or in a positioning device.

For some applications, the oscillator signal is required to have a highly stable frequency. Examples of such applications are evolved mobile communication systems, such as mobile communication systems according to the UMTS (Universal Mobile Telecommunications System), or satellite-based positioning systems, such as GPS (Global Positioning System).

However, conventional oscillator crystals typically do not provide the required frequency stability. In particular, the frequency may vary along with the temperature of the oscillator crystals.

BRIEF SUMMARY OF THE INVENTION

In an embodiment, an electronic device is provided. The electronic device comprises an oscillator interface and a temperature measurement interface. Further, the electronic device comprises an oscillator circuit, a measurement controller, a frequency drift estimator, and a compensation logic. The oscillator interface is to be coupled to an oscillator crystal of an oscillator interface, and the temperature measurement interface is to be coupled to a temperature sensor of the oscillator element so as to receive a temperature signal. The oscillator circuit is coupled to the oscillator interface and is configured to generate an oscillator signal. The measurement controller is coupled to the temperature measurement interface and is configured to measure a first value of the temperature signal at a first point of time and a second value of the temperature signal at a second point of time. The frequency drift estimator is configured to estimate a frequency drift of the oscillator signal on the basis of the first value of the temperature signal and the second value of the temperature signal. The compensation logic is configured to generate a frequency compensation signal for the oscillator circuit on the basis of the estimated frequency drift.

It is to be understood that the above summary is only intended to provide an abbreviated overview of some features of some embodiments of the present invention and is not to be construed as limiting. In particular, other embodiments may comprise less features, more features and/or alternative features.

Figure 1:
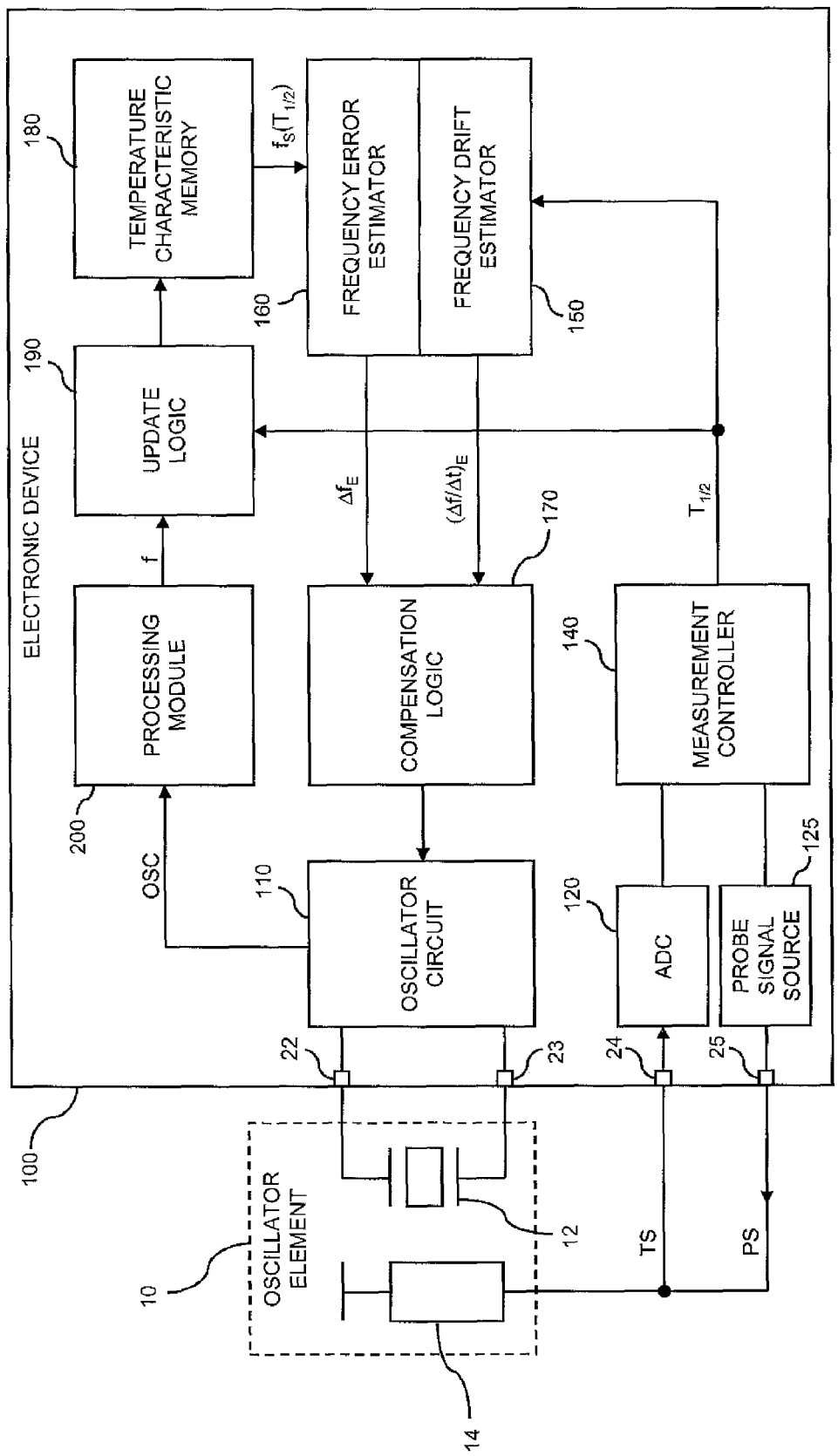
FIG. 1 schematically illustrates an electronic device according to an embodiment of the invention.

In the following, some embodiments of the present invention will be described in more detail and with reference to the accompanying drawings. It is to be understood that the following description is given only for the purpose of illustration and is not to be taken in a limiting sense. The scope of the invention is not intended to be limited by the embodiments as described hereinafter, but is intended to be limited only by the appended claims.

Further, it is to be understood that in the following description of embodiments any direct connection or coupling between functional blocks, devices, components, circuit elements or other physical or functional units as described or shown in the drawings could also be implemented by an indirect connection or coupling, i.e. a connection or coupling comprising one or more intervening elements. Furthermore, it should be appreciated that functional blocks or units shown in the drawings may be implemented as separate circuits, but may also be fully or partially implemented in a common circuit. In other words, the description of various functional blocks is intended to give a clear understanding of various functions performed in a device and is not to be construed as indicating that these functional blocks have to be implemented as separate functional units. For example, one or more functional blocks may be implemented by programming a processor with suitably designed program code.

It should be noted that the drawings are provided to give an illustration of some aspects of embodiments of the present invention and therefore are to be regarded as schematic only. In particular, the elements as shown in the drawings are not necessarily to scale with each other, and the placement of various elements and drawings is chosen to provide a clear understanding of the respective embodiment and is not to be construed as necessarily being a representation of the actual relative location of the illustrated structures.

It is to be understood that the features of the various embodiments described herein may be combined with each other as appropriate. On the other hand, describing an embodiment with a plurality of features is not to be construed as indicating that all the described features are necessary for practicing the present invention. For example, other embodiments may comprise less features and/or alternative features.

Turning now to the figures, FIG. 1 schematically illustrates an electronic device 100 according to an embodiment of the present invention. The electronic device 100 may be implemented using one or more integrated circuits, possibly in combination with additional elements like resistors, capacitors, antennas, or the like. As further illustrated, the electronic device 100 is coupled to an oscillator element 10. The oscillator element 10 comprises an oscillator crystal 12.

Further, the oscillator element 10 comprises a temperature sensor 14, e.g. a temperature-sensitive diode or resistor. Thermal coupling of the temperature sensor 14 to the oscillator crystal 12 may be accomplished, e.g. by placing the temperature sensor 14 in vicinity of the oscillator crystal 12, by connecting the temperature sensor 14 to the oscillator crystal 12 via a heat conducting material, such as thermal grease or the like, by placing the temperature sensor 14 and the oscillator crystal in a common housing or package, or any combination thereof. In some embodiments, the temperature sensor 14 may be a resistor with a negative temperature coefficient, sometimes also referred to as a NTC resistor. In the illustrated example, the temperature sensor is illustrated as with one terminal coupled to a given potential, e.g. ground, while the other terminal is available for receiving a probe signal and/or extracting a temperature signal. Such a configuration may be used, e.g., if the temperature sensor 14 is a resistor. However, it is to be understood that, depending on the type of the temperature sensor 14, the temperature sensor 14 may be connected in other configurations. The oscillator element 10, which includes the oscillator crystal 12 and the temperature sensor 14, may be implemented as a "system in package" (SiP).

The electronic device 100 comprises an oscillator circuit 110. The oscillator circuit 110 is configured to generate an oscillator signal OSC, which may have various signal forms, e.g. sinusoidal, trapezoidal, rectangular. The oscillator signal may also have the form of a digital clock signal. In some embodiments, the oscillator circuit 110 may be configured as a frequency synthesizer circuit. In further embodiments, the oscillator circuit may be configured as a clock generator circuit. The oscillator circuit 110 may comprise various types of oscillator circuitry suitable for coupling to the oscillator crystal 12, e.g. an analog reference oscillator. Such oscillator circuitry may be composed of resistors, capacitors, transistors, or the like. Moreover, the oscillator circuit 110 may comprise a phase-locked-loop (PLL), e.g. an N-fractional PLL, and/or a signal shaper configured to output the oscillatory signal with a desired signal form, e.g. as a digital clock signal switching between two binary values.

In the illustrated example, the oscillator circuit 110 is coupled to the oscillator element 10 via an oscillator interface of the electronic device 100, which is provided by terminals 22, 23. By using the oscillator interface, the oscillator element 10 with the oscillator crystal 12 may be located spaced apart from the electronic device 100, which reduces temperature variation of the oscillator crystal 12 due to heat generated by the electronic device 100.

As further illustrated, the electronic device 100 comprises terminals 24, 25 for coupling to the temperature sensor 14 of the oscillator element 10. The terminals 24, 25 implement a temperature measurement interface of the electronic device 100. Via the temperature measurement interface, the electronic device 100 may receive a temperature signal TS from the temperature sensor 14.

In the illustrated example, the temperature signal TS is an analog signal and the electronic device 100 comprises an analog-to-digital converter (ADC) 120 for converting the temperature signal TS to a digital signal. Further, the electronic device 100 comprises a probe signal source 125, which is configured to supply a probe signal PS to the temperature sensor 14 of the oscillator element 10. According to an embodiment, the probe signal PS is a current, and the temperature signal TS is a voltage generated at the temperature sensor 14.

It is to be understood, that other types of temperature signals are conceivable as well. For example, the temperature signal TS may be a digital signal, e.g. generated by an ADC in the oscillator element 10, or a current. Depending on the type of the temperature signal TS and the implementation of the temperature measurement in the oscillator element 10, the ADC 120 and/or the probe signal source 125 of the electronic device 100 may be omitted or replaced by other elements.

The electronic device 100 further comprises a measurement controller 140. The measurement controller 140 is configured to control measurements of the temperature signal TS. In particular, the measurement controller 140 is configured to measure at least a first value of the temperature signal TS at a first point of time and a second value of the temperature signal TS at a second point of time. According to one implementation, the measurement controller 140 may repeatedly measure the value of the temperature signal TS at regular time intervals, thereby continuously generating new pairs of first and second values. As used herein, the first and second values may be any pair of values measured at different points of time, e.g. two subsequently measured values. For performing the measurements, the measurement controller 140 suitably controls the ADC 120 and/or the probe signal source 125. In the following explanations, the first value of the temperature signal is referred to as $T_1$, and the second value of the temperature signal is referred to as $T_2$.

As further illustrated, the electronic device 100 comprises a frequency drift estimator 150, and a frequency error estimator 160. The measured values of the temperature signal TS, i.e. the first temperature signal value $T_1$ and the second temperature signal value $T_2$, are supplied to the frequency drift estimator 150 and the frequency error estimator 160.

The frequency drift estimator uses the values $T_1$ and $T_2$ for estimating a frequency drift of the oscillator signal OSC. This may be accomplished using a stored temperature characteristic of the oscillator signal frequency as stored in a temperature characteristic memory 180 of the electronic device 100. The temperature characteristic relates a value of the temperature signal to a corresponding value of the frequency of the oscillator signal OSC. Here, it is to be understood that the frequency may also be expressed as a frequency error, i.e. the deviation of the frequency from a nominal frequency. In FIG. 1, the value of the frequency corresponding to a value T of the temperature signal is denoted by $f_S(T)$. The temperature characteristic may be stored in the form of parameters of an approximating function to the temperature characteristic. For example, the approximating function may be a polynomial of at least third order and the stored parameters may be coefficients of the polynomial. According to other implementations, other approximating functions may be used, e.g. a polynomial of fourth or higher order, a Lagrange approximation, or a Spline approximation. Moreover, the temperature characteristic could also be stored in the form of a look-up table.

In one embodiment, the frequency drift estimator may use a difference between the first value $T_1$ of the temperature signal and the second value $T_2$ of the temperature signal and/or a difference between a first frequency value $f(T_1)$ corresponding to the first temperature signal value and a second frequency value $f(T_2)$ corresponding to the second temperature signal value for calculating the estimated frequency drift. According to one implementation, the estimated frequency drift may be calculated according to $$(\Delta f / \Delta t)_E = \frac{f(T_2) - f(T_1)}{T_2 - T_1} \qquad (1)$$

Here, it is to be noted that the frequency values used in the calculation may be obtained from the stored temperature characteristic, i.e. may be the values $f_S(T)$. However, in some situations also evaluated frequency values may be available and may be used in the calculation of the estimated frequency drift. This will be further explained below.

The frequency error estimator 160 is configured to estimate a frequency error Δf of the oscillator signal OSC. This may be accomplished using the first temperature signal value $T_1$ and/or the second temperature signal value $T_2$ and the stored temperature characteristic. In particular, the frequency error estimator 160 may use the temperature signal value to obtain the corresponding frequency value $f_S(T)$ according to the stored temperature characteristic, which may in turn be used to calculate the deviation from a nominal frequency. In some situations, the frequency error Δf may also be determined from an evaluated frequency value, without using the stored temperature characteristic.

The electronic device 100 further comprises a compensation logic 170 which receives at least the estimated frequency drift $(\Delta f/\Delta t)_E$ from the frequency drift estimator 150. According to an embodiment, the compensation logic 170 may further receive the estimated frequency error Δf from the frequency error estimator 160. The compensation logic 170 is configured to generate a frequency compensation signal on the basis of the estimated frequency drift $(\Delta f/\Delta t)_E$, and optionally also on the basis of the estimated frequency error Δf. According to an embodiment, the frequency compensation signal may be generated so as to correspond to a frequency drift which has an inverse characteristic of the estimated frequency drift. For this purpose, a value of the frequency compensation signal may be increased or decreased at a rate which is proportional to the estimated frequency drift. The frequency compensation signal is applied to the oscillator circuit 110 so as to compensate temperature-induced variations of the frequency of the oscillator signal OSC. Using the estimated frequency drift $(\Delta f/\Delta t)_E$ as a basis for generating the frequency compensation signal allows for stabilizing the frequency in a very efficient manner.

As further illustrated, the electronic device 100 comprises a processing module 200 which is configured to operate on the basis of the oscillator signal OSC. The processing module 200 may be a positioning module, e.g. a GPS module, or may be a mobile communication module, e.g. according to the UMTS standard. In the processing module 200, the oscillator signal OSC may be used for processing received high-frequency signals, e.g. positioning signals received from satellites or wireless communication signals received from a base station. In a mobile communication scenario, the oscillator signal OSC may also be used in the process of transmitting signals to the base station.

Among other functions related to the specific purpose of the processing module 200, the processing module 200 may also be configured to evaluate parameters of the oscillator signal OSC. In particular, the processing module 200 may evaluate the frequency of the oscillator signal OSC. If the processing module 200 is a positioning module, the frequency f may be evaluated on the basis of a position fix. If the processing module 200 is a mobile communication module, the frequency f may be evaluated from synchronization with a base station. Other parameters of the oscillator signal OSC may be evaluated as well, e.g. a frequency drift, or an uncertainty of the evaluated frequency drift. In some embodiments, the processing module 200 may also comprise a positioning sub-module and a mobile communication sub-module. In such a scenario, the mobile communication sub-module could deliver a synchronized oscillator signal of known frequency, which is obtained from synchronization with a base station, to the positioning sub-module, which then compares the oscillator signal to the synchronized oscillator signal so as to evaluate the parameters of the oscillator signal, e.g. frequency, frequency error, frequency drift, uncertainty of the evaluated frequency drift.

The evaluated parameters of the oscillator signal OSC may be used for various purposes. In the illustrated example, the electronic device 100 comprises an update logic 190 which is supplied with the evaluated frequency f and/or other parameters of the oscillator signal OSC. The update logic 190 further receives the measured value of the temperature signal TS. On the basis of these values, the update logic 190 may adapt the temperature characteristic as stored in the temperature characteristic memory 180. In this way, the accuracy of the stored temperature characteristic may be improved. Further, aging of the oscillator crystal 12 may be taken into account.

Figure 2:
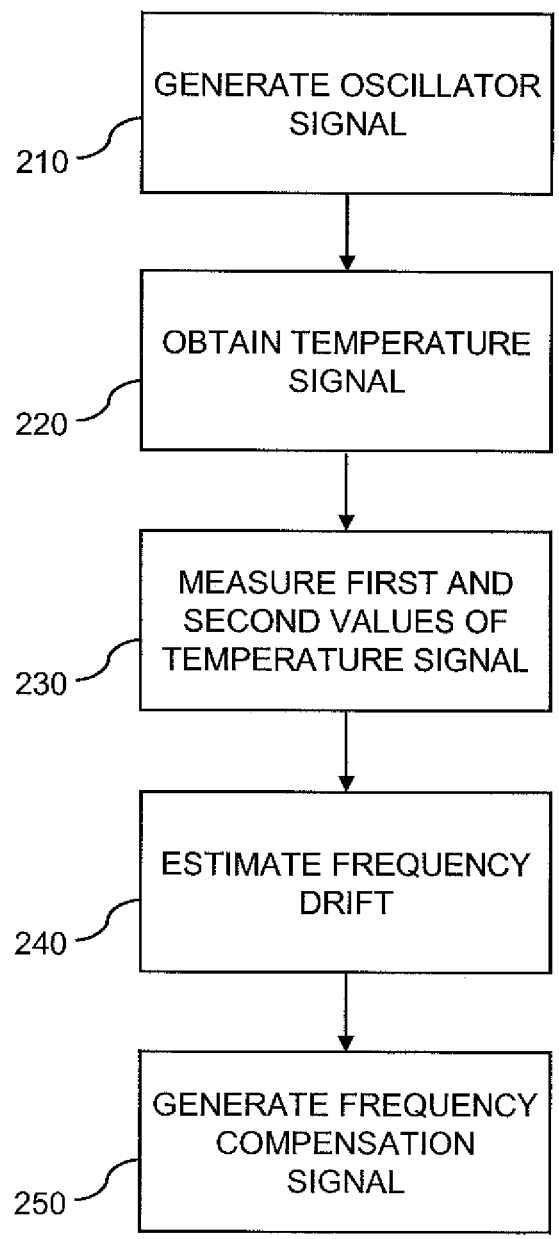
FIG. 2 shows a flow chart for schematically illustrating a method according to an embodiment of the invention.

FIG. 2 shows a flow chart for schematically illustrating a method of temperature compensation according to an embodiment of the invention. The method may be implemented in an electronic device as illustrated in FIG. 1.

At step 210, an oscillator signal is generated, e.g. by the oscillator circuit 110 as illustrated in FIG. 1. For this purpose, the oscillator circuit is coupled to an oscillator crystal, e.g. the oscillator crystal 12 of the oscillator element 10 as illustrated in FIG. 1.

At step 220, a temperature signal representing the temperature of the oscillator crystal is obtained. As explained in connection with FIG. 1, the temperature signal may be an analog voltage generated at a temperature sensor, e.g. a NTC resistor or the like. The temperature sensor may be placed together with the oscillator crystal in an oscillator element, e.g. in a single electronic device package. For generating the temperature signal, a probe signal may be supplied to the temperature sensor, e.g. a probe current.

At step 230, a first value of the temperature signal is measured at a first point of time, and a second value of the temperature signal is measured at a second point of time. These measurements may be controlled by the measurement controller 140 as illustrated in FIG. 1 and may involve converting the analog temperature signal to digital values, e.g. by the ADC 120 as illustrated in FIG. 1, and supplying a probe signal to the temperature sensor, e.g. by the probe signal source 125 as illustrated in FIG. 1. For accomplishing the measurements, the measurement controller may suitably set parameters of the ADC 120 and/or of the probe signal source 125. For example, the probe signal source 125 may be controlled to supply the probe signal only during sampling intervals of the ADC 120, thereby avoiding unnecessary heat generation at the temperature sensor and reducing power consumption.

At step 240, a frequency drift of the oscillator is estimated on the basis of the measured first and second values of the temperature signal. This may be accomplished by the drift estimator 150 as illustrated in FIG. 1. As explained above, the frequency drift may be estimated on the basis of a stored temperature characteristic of the oscillator signal frequency. The temperature characteristic may be stored in a corresponding memory, e.g. the temperature characteristic memory 180 as illustrated in FIG. 1. The temperature characteristic may be stored in the form of coefficients of an approximating function to the temperature characteristic. The approximating function may be a polynomial of at least third order or any other kind of approximating function. Using the stored temperature characteristic, frequency values corresponding to the measured first and second values of the temperature signal may be obtained and used for calculating the estimated frequency drift. In particular, estimating the frequency drift may involve calculating a difference between the first value of the temperature signal and the second value of the temperature signal and/or calculating a difference between a first frequency value corresponding to the first value of the temperature signal and a second frequency value corresponding to the second value of the temperature signal. According to one implementation, the estimated frequency drift may be calculated in the above-described manner using equation (1). In addition or as an alternative to using a stored temperature characteristic for obtaining the frequency values corresponding to the measured values of the temperature signal, frequency values may be used which have been evaluated from the oscillator signal. For example, the frequency values may be evaluated from a position fix obtained by a positioning module operating on the basis of the oscillator signal and/or from synchronization with a base station as accomplished by the mobile communication module operating on the basis of the oscillator signal.

In addition to estimating the frequency drift, also a frequency error may be estimated on the basis of the first and/or the second measured values of the temperature signal. For estimating the frequency error of the oscillator signal, the measured value of the temperature signal may be used in connection with the stored temperature characteristic. Further, a frequency error may also be estimated from frequency values which have been evaluated from the oscillator signal in the above-mentioned manner, e.g. from a position fix or from synchronization with a base station.

At step 250, a frequency compensation signal for the oscillator circuit is generated at least on the basis of the estimated frequency drift. This may be accomplished by the compensation logic 170 as illustrated in FIG. 1. The compensation signal may be a control signal for a digital PLL of the oscillator circuit. For example, the frequency compensation signal may control an N-fractional divider of the PLL. Using the frequency compensation signal, the frequency of the oscillator signal may be controlled so as to counteract the frequency drift. In this manner, the frequency of the oscillator signal may be stabilized in a very effective manner.

Figure 3:
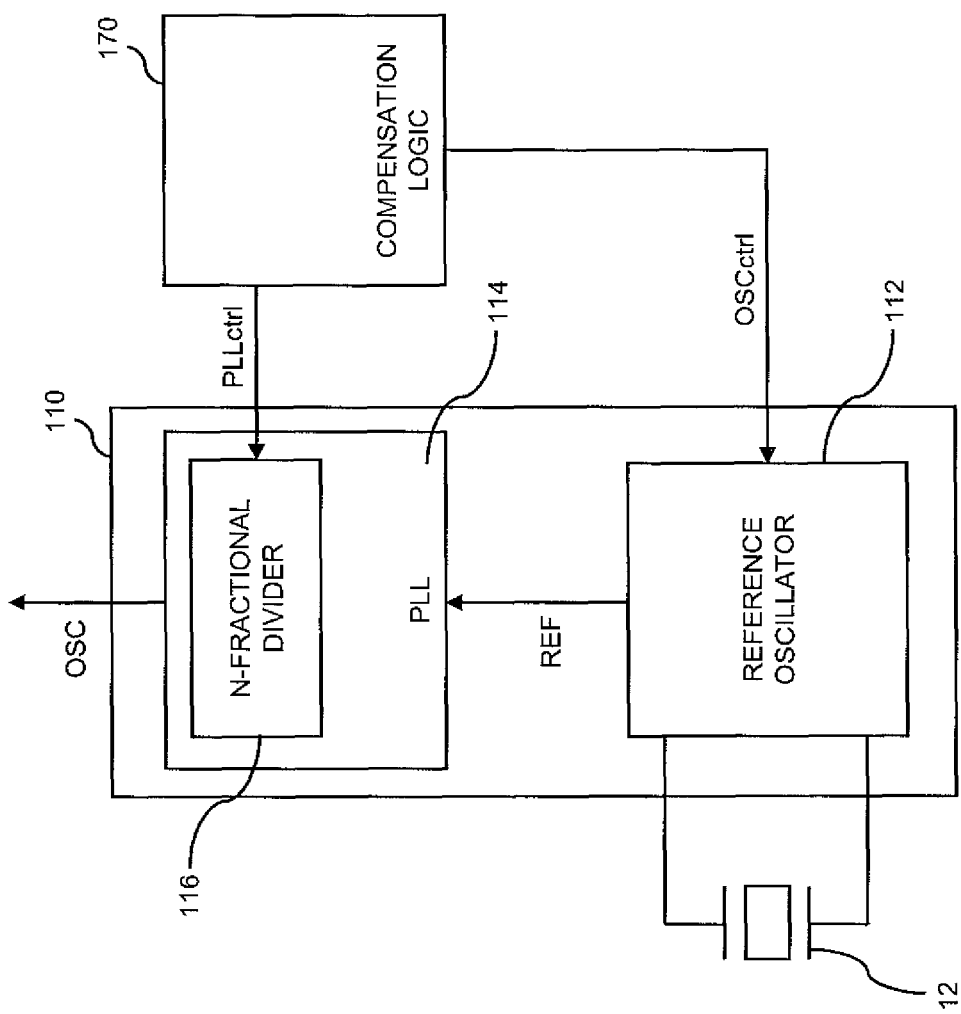
FIG. 3 schematically illustrates an oscillator circuit according to an embodiment of the invention.

FIG. 3 schematically illustrates an exemplary implementation of the oscillator circuit 110.

As illustrated, the oscillator circuit 110 comprises a reference oscillator 112 which is coupled to the oscillator crystal 12. The reference oscillator may be implemented using a known type of oscillator circuitry. The reference oscillator outputs a reference oscillator signal REF.

The oscillator circuit 110 further comprises a PLL 114 operating on the basis of the reference oscillator signal REF. According to the illustrated example, the PLL is implemented as an N-fractional PLL and comprises an N-fractional divider 116. The N-fractional divider may be arranged in a feedback path of the PLL. Due to the N-fractional divider, the oscillator signal OSC as generated by the oscillator circuit 110 has a frequency f which corresponds to the frequency of the reference oscillator signal REF multiplied by a divider $N_{fractional}$ of the N-fractional divider 116.

As illustrated, the compensation logic 170 supplies the frequency compensation signal to the oscillator circuit 110 in the form of a PLL control signal PLLctrl, which is used to adjust the divider $N_{fractional}$ of the N-fractional divider 116 in the PLL 114. In this way, the frequency of the oscillator signal OSC may be digitally controlled in a precise and efficient manner. In addition or as an alternative, the frequency compensation signal may also be supplied to the oscillator circuit 110 in the form of a reference oscillator control signal OSCctrl, which causes the reference oscillator 112 to adapt is operation. In the latter case, the frequency compensation signal may be used to control the frequency of the reference oscillator signal REF.

It is to be understood that the control mechanism on the basis of adjusting the N-fractional divider and/or the reference oscillator as illustrated in FIG. 3 is only one example of adapting the oscillator circuit 110 so as to accomplish temperature compensation. For example, the frequency compensation signal could also be used to control other components of the PLL and/or the oscillator circuit 110 may comprise further components which are adjustable on the basis of the frequency compensation signal.

Figure 4:
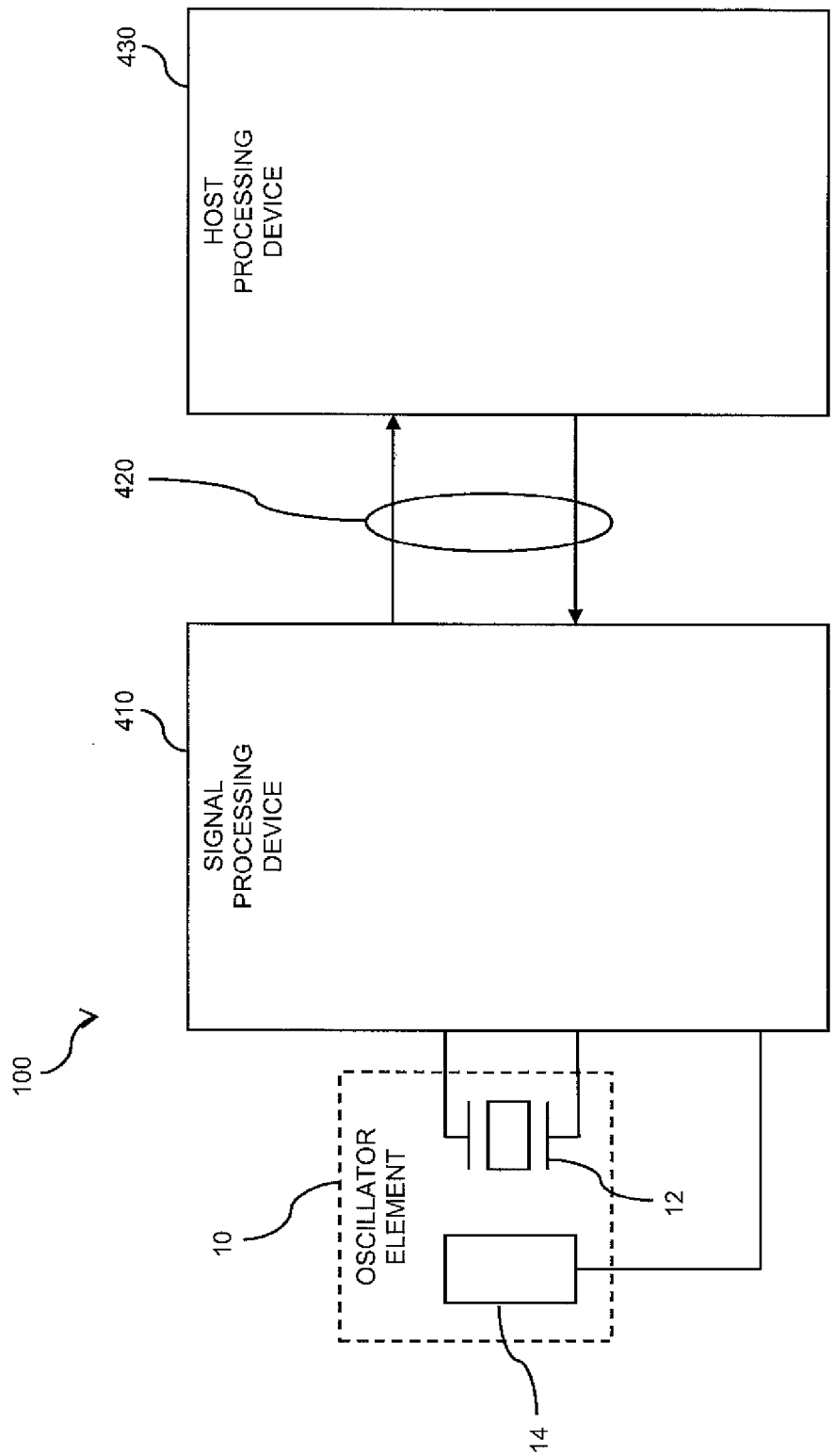
FIG. 4 schematically illustrates a multi-device implementation of an electronic device according to an embodiment of the invention.

FIG. 4 schematically illustrates a multi-device implementation of the electronic device 100 as described in connection with FIG. 1. In the illustrated example, the electronic device 100 comprises a signal processing device 410 and a host processing device 430 which are coupled to each other via a host interface 420. The signal processing device 410 may be implemented by a corresponding integrated circuit, and the host processing device 430 may be implemented by a corresponding integrated circuit.

The signal processing device 410 and the host processing device 430 may together implement the functions of the electronic device 100 as illustrated in FIG. 1. It is to be understood that the functions may be distributed among the signal processing device 410 and the host processing device 430 in various manners. For example, the signal processing device 410 may comprise the oscillator circuit 110, the ADC 120 and the probe signal source 125. Further, the signal processing device 410 may also comprise a part of the processing module 200, a part of the compensation logic 170, and/or a part of the measurement controller 140. These elements may be implemented by hardware of the signal processing device and/or firmware of the signal processing device 410.

The host processing device 430 may in turn comprise the frequency drift estimator 150, the frequency error estimator 160, the temperature characteristic memory 180, the update logic 190, and at least a part of the measurement controller 140, at least a part of the compensation logic 170, and at least a part of the processing module 200. These elements may be implemented by software executed by a processor of the host processing device 430.

According to one example, the electronic device 100 implements positioning functions, e.g. using GPS or other satellite-based positioning system. In such a case, the signal processing device 410 may be adapted for accomplishing processing of received positioning signals, such as down-conversion of received positioning signals from RF signals to base-band signals, analog-to-digital conversion, code-correlation, or the like. The host processing device 430 may in turn implement a positioning engine which accomplishes evaluation of the received positioning signals so as to obtain a position fix. According to another example, the electronic device 100 implements mobile communication functions. In such a case, the signal processing device 410 may be adapted to perform, signal processing of received and/or transmitted communication signals, such as demodulation, down-conversion from RF signals to base-band signals, analog-to-digital conversion, decoding, or the like. The host processing device 430 may then in turn accomplish higher-level communication functions, such as data processing according to specific communication protocols or the like.

Figure 5:
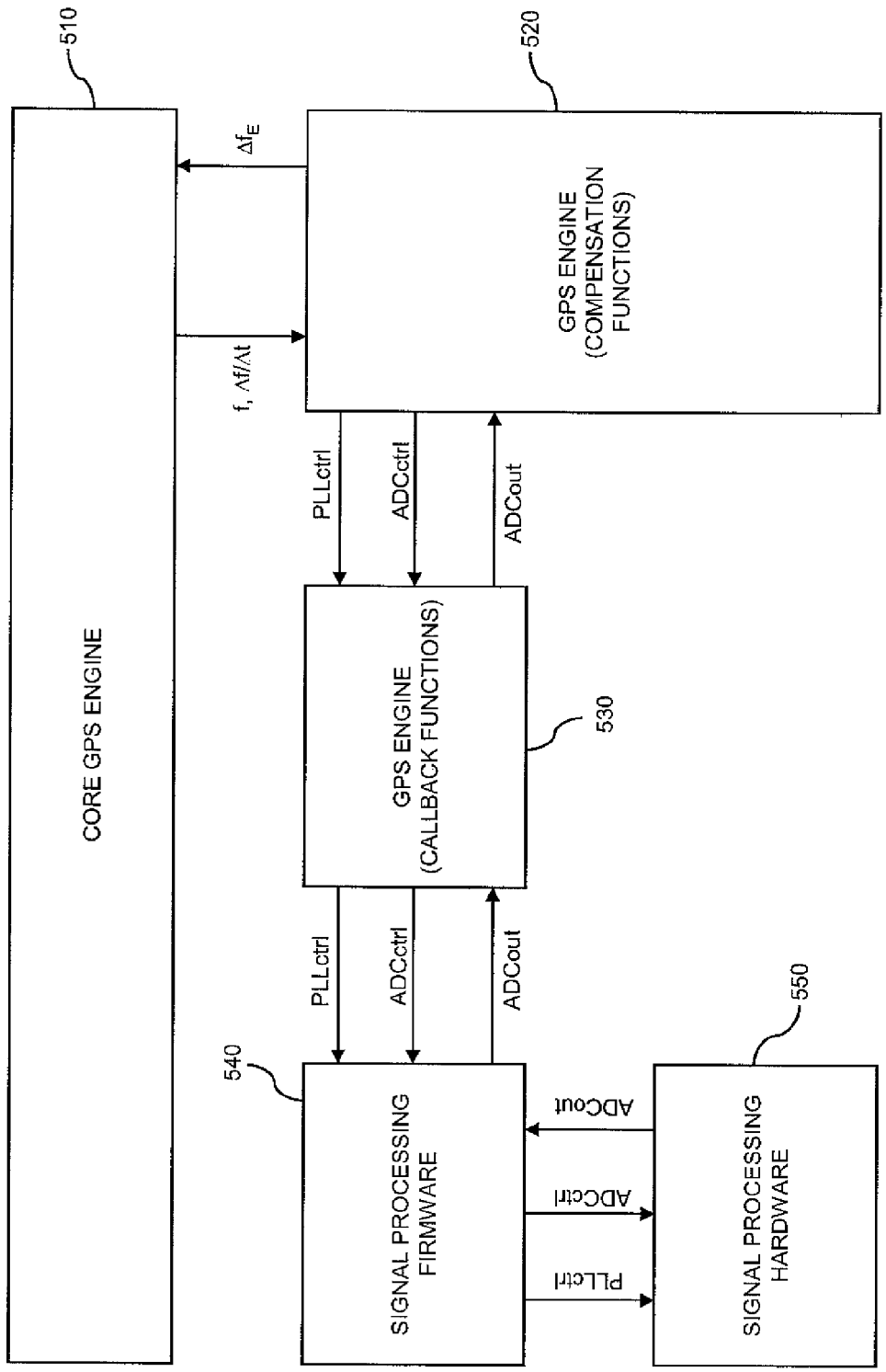
FIG. 5 shows a block diagram for schematically illustrating functions in an electronic device according to an embodiment of the invention.

FIG. 5 shows a block diagram for schematically illustrating an implementation of the electronic device according to the above-mentioned GPS scenario. As illustrated, functions of the electronic device may be assigned to a number of functional blocks which comprise a core GPS engine 510, GPS engine compensation functions 520, GPS engine callback functions 530, signal processing firmware 540, and signal processing hardware 550. Assuming the device structure as illustrated in FIG. 4, the core GPS engine 510, the GPS engine compensation functions 520, and the GPS engine callback functions 530 may be implemented by the host processing device 430, whereas the signal processing firmware 540 and the signal processing hardware 550 may be implemented by the signal processing device 410.

The core GPS engine 510 may implement functions such as frequency evaluation on the basis of a predicted frequency change, frequency evaluation on the basis of a position fix, frequency drift evaluation on the basis of a predicted frequency change, frequency drift evaluation on the basis of a position fix, or evaluation of an uncertainty of the evaluated frequency or frequency drift. These results, i.e. the evaluated frequency f, the evaluated frequency drift $\Delta f/\Delta t$, and or the other evaluated parameters, may also be passed to the GPS engine compensation function 520.

The GPS engine compensation functions 520 may implement functions such as providing temperature characteristic data, e.g. by approximating the temperature characteristic as a polynomial of third or higher order, calculating temperature values representing the oscillator crystal temperature on the basis of an ADC output signal, estimating the frequency, the frequency error, and/or the frequency drift on the basis of the temperature values and the stored temperature characteristic, and generating the frequency compensation signal at least on the basis of the estimated frequency drift. The GPS engine compensation functions 520 may also predict a frequency change $\Delta f_E$, which may be supplied to the core GPS engine 510.

As illustrated, the GPS engine compensation functions 520 communicate with the signal processing firmware 540 via the GPS engine callback functions 530. In particular, the GPS engine compensation functions 520 communicate the frequency compensation signal, in the form of the PLL control signal PLLctrl, and an ADC control signal ADCctrl to the signal processing firmware 540 and the signal processing firmware 540 communicates the ADC output signal ADCout to the GPS engine compensation functions 520 via the GPS engine callback functions 530.

Among other known signal processing functions, the signal processing firmware 540 implements functions such as configuration of the ADC 120, reading values of the ADC at the desired points of time, and generating the frequency compensation signal, in the form of the PLL control signal PLLctrl to be supplied to the PLL of the oscillator circuit 110. Here, it is to be understood that the GPS engine compensation function may generate the PLL control signal PLLctrl at a lower update rate than the signal processing firmware 540. For example, the GPS engine compensation function may generate the PLL control signal PLLctrl at an update rate of a few seconds, e.g. about 1 s, whereas the signal processing firmware 540 may generate the PLL control signal PLLctrl at an update rate of a few milliseconds, e.g. about 1 ms. Since the PLL control signal PLLctrl is generated on the basis of the estimated frequency drift, the signal processing firmware 540 is able to perform a precise interpolation between the values as provided by the GPS engine compensation functions 520.

The signal processing firmware 540 delivers the measured values of the temperature signal, i.e. the ADC output signal ADCout, to the GPS engine compensation functions 540, which is accomplished via the GPS engine callback functions 530. Further, the signal processing firmware 540 supplies the PLL control signal PLLctrl and the ADC control signal ADCctrl to the signal processing hardware 550.

Among other signal processing functions, the signal processing hardware 550 may comprise an ADC for accomplishing analog-to-digital conversion of the temperature signal, e.g. the ADC 120. Further, the signal processing hardware 550 may accomplish averaging of ADC values. In this way, the ADC output signal ADCout is generated. In addition, the signal processing hardware 550 comprises the oscillator circuit with the PLL configured to be adapted on the basis of the PLL control signal PLLctrl, e.g. the oscillator circuit 110.

The signal processing hardware 550 supplies the ADC output signal, i.e. the values as obtained by analog-to-digital conversion of the temperature signal and optionally averaging, to the signal processing firmware 540.

It is to be understood that the functions as explained in connection with FIG. 5 and their arrangement are merely exemplary and that other functions could be implemented and/or the functions could be assigned to the functional blocks in a different manner.

Figure 6:
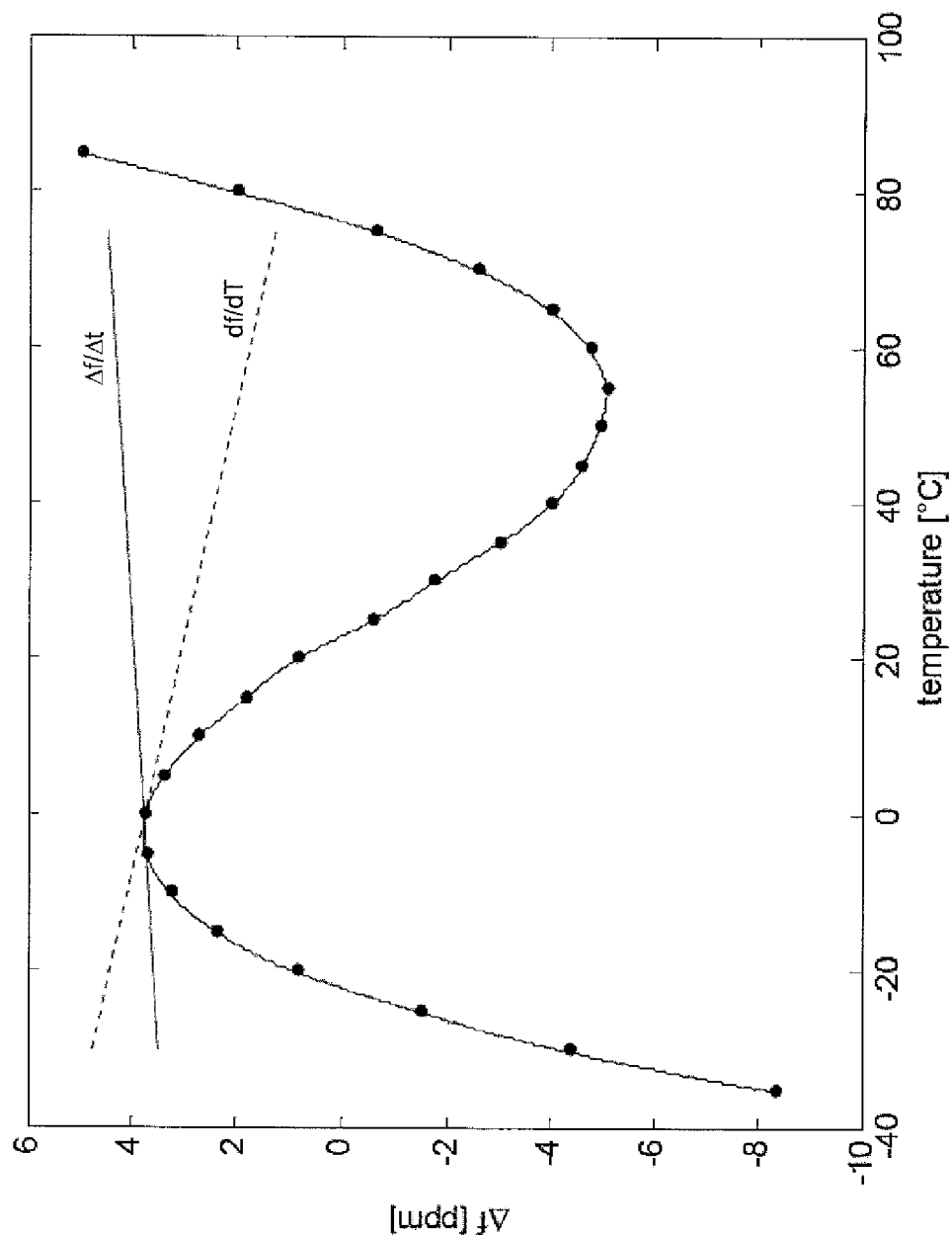
FIG. 6 shows an exemplary temperature characteristic of an oscillator crystal as used in an embodiment of the invention.

FIG. 6 shows a diagram representing an exemplary temperature characteristic of an oscillator crystal, e.g. the oscillator crystal 12 as shown in FIG. 1. Specifically, FIG. 6 shows a frequency error $\Delta f$ as a function of the temperature T. In the illustrated example, the temperature characteristic is approximated by a third order polynomial.

In the figure, a straight solid line illustrates the gradient df/dT of the temperature characteristic at 0° C., whereas a straight dashed line illustrates the frequency drift $\Delta f/\Delta t$ as estimated according to the above-mentioned concepts. As can be seen, both the gradient and the estimated frequency drift can be used to predict the further course of the frequency error $\Delta f$ and therefore be used as a basis for efficiently compensating frequency variations due to changes in the temperature.

Figure 7:
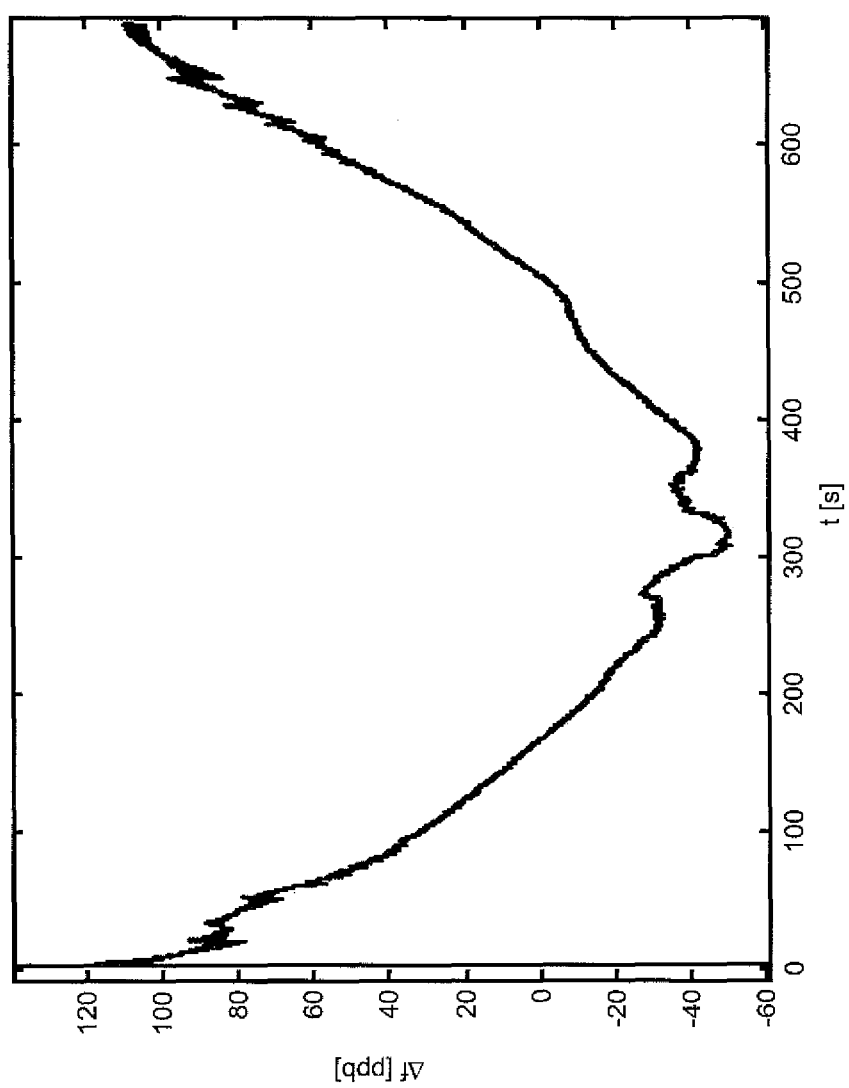
FIG. 7 shows exemplary simulation results representing the frequency error of an oscillator signal as a function of time when applying a temperature gradient.

FIG. 7 shows exemplary simulation results representing the frequency error $\Delta f$ as a function of time, denoted by t, during a temperature ramp of 10° C./min when implementing temperature compensation according to the above-described concepts. As can be seen, the frequency of the oscillator signal can be stabilized so as to limit frequency variations to significantly less than 1 ppm.

Figure 8:
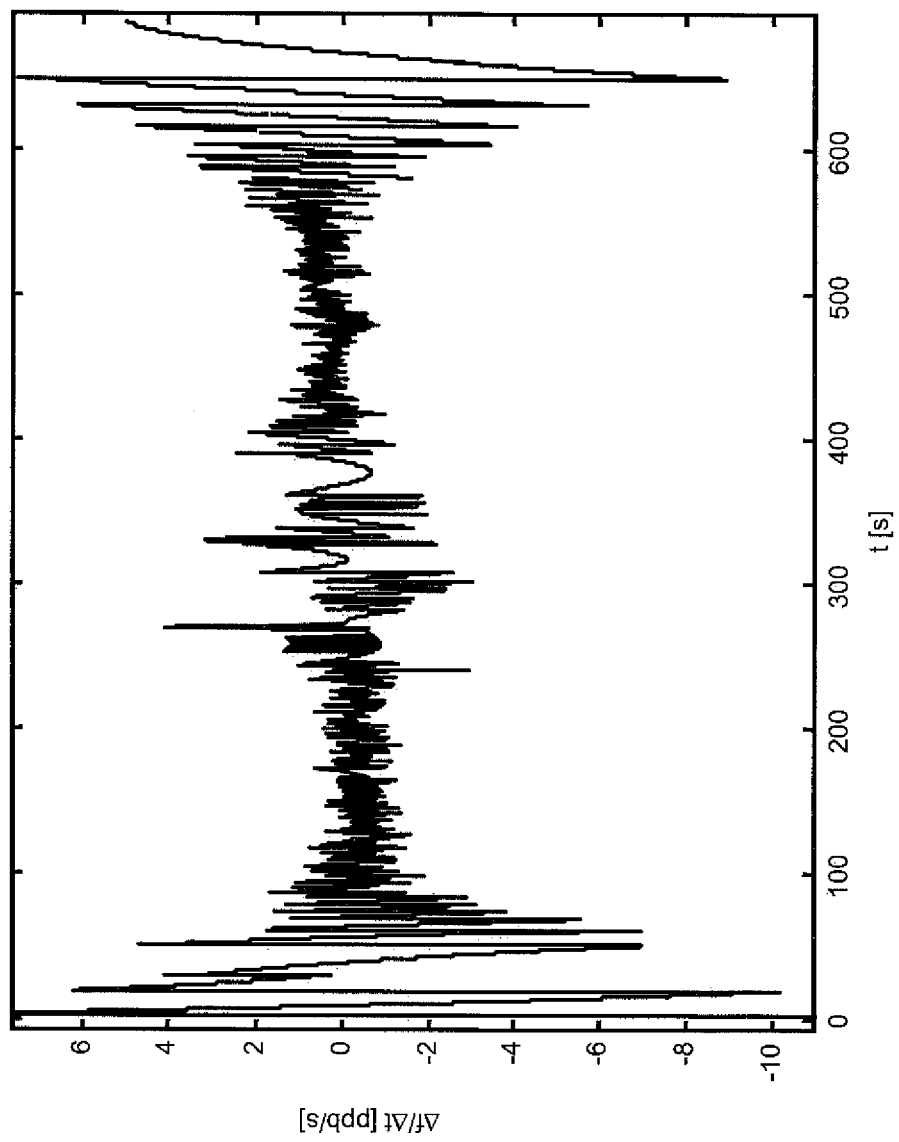
FIG. 8 shows exemplary simulation results representing the frequency drift of an oscillator signal as a function of time when applying a temperature gradient.

FIG. 8 shows simulation results representing the frequency drift $\Delta f/\Delta t$ as a function of time during a temperature ramp of 10° C./min when applying the above-described concepts of temperature compensation. As can be seen, the frequency drift is controlled in an efficient manner and is typically kept in the range of a few ppb/s.

It should be noted that the numerical values of the simulation results as shown in FIGS. 7 and 8 serve only for the purpose of further illustrating the concepts according to some embodiments of the present invention and are not to be construed as limiting.

It is to be understood that the above-described embodiments serve only as examples for implementations of concepts according to the present invention, and that these concepts may be applied in various manners which are not restricted to the described embodiments. For example, the concepts of temperature compensation as described herein may be applied in other systems than positioning systems or mobile communication systems. Moreover, the above-described embodiments are susceptible to various modifications. For example, the frequency compensation signal may not only be generated on the basis of the estimated frequency drift or frequency error, but may also be generated taking into account further parameters, such as temperature overshoot in dependence of a change in temperature or activity dips, which may cause temporal deviations of the frequency drift. Also, it is to be understood that the temperature characteristic of the oscillator crystal may be represented in any suitable manner, e.g. using various forms of approximating functions which may deviate from the above-mentioned types of approximating functions or may even combine different types of approximating functions. Further, although the above embodiments illustrate the oscillator element 10 as a separate component spaced apart from the electronic device 100, other embodiments could implement the oscillator element 10 and at least a part of the oscillator circuit 110 together in a separate component spaced apart from the electronic device 100, e.g. in an SiP component.

The invention claimed is:

1. An electronic device, comprising:
an oscillator interface to be coupled to an oscillator crystal of an oscillator element,
an oscillator circuit coupled to the oscillator interface and configured to generate an oscillator signal,
a temperature measurement interface to be coupled to a temperature sensor of the oscillator element so as to receive a temperature signal,
a measurement controller coupled to the temperature measurement interface and configured to measure a first value of the temperature signal at a first point of time and a second value of the temperature signal at a second point of time,
a frequency drift estimator configured to estimate a frequency drift of the oscillator signal on the basis of the first value of the temperature signal and the second value of the temperature signal, and
a compensation logic configured to generate a frequency compensation signal for the oscillator circuit on the basis of the estimated frequency drift.

2. The electronic device according to claim 1, wherein the frequency drift estimator is configured to estimate the frequency drift on the basis of a stored temperature characteristic of the oscillator signal frequency.

3. The electronic device according to claim 1, wherein at least a part of the temperature characteristic is stored in the form of parameters of an approximating function to the temperature characteristic.

4. The electronic device according to claim 2, comprising: an update logic configured to adapt the stored temperature characteristic on the basis of measured values of the temperature signal and corresponding evaluated frequency values of the oscillator signal.

5. The electronic device according to claim 1, wherein the frequency drift estimator is configured to estimate the frequency drift on the basis of evaluated frequency values of the oscillator signal.

6. The electronic device according to claim 1, wherein the frequency drift estimator is configured to estimate the frequency drift on the basis of a difference between the first value of the temperature signal and the second value of the temperature signal.

7. The electronic device according to claim 1, wherein the frequency drift estimator is configured to estimate the frequency drift on the basis of difference between a first frequency value corresponding to the first value of the temperature signal and a second frequency value corresponding to the second value of the temperature signal.

8. The electronic device according to claim 1, comprising: a frequency error estimator configured to estimate a frequency error of the oscillator signal on the basis of the first value of the temperature signal and/or the second value of the temperature signal.

9. The electronic device according to claim 8, wherein the compensation circuit is configured to generate the frequency compensation signal on the basis of the estimated frequency error.

10. The electronic device according to claim 1, wherein the oscillator circuit comprises a phase-locked-loop configured to be adapted on the basis of the frequency compensation signal.

11. The electronic device according to claim 10, wherein the phase locked loop comprises a frequency divider configured to be controlled on the basis of the frequency compensation signal.

12. The electronic device according to claim 1, wherein the oscillator circuit comprises a reference oscillator configured to be adapted on the basis of the frequency compensation signal.

13. The electronic device according to claim 1, comprising: an analog-to-digital converter coupled to the temperature measurement interface.

14. The electronic device according to claim 1, comprising: a probe signal source coupled to the temperature measurement interface.

15. The electronic device according to claim 1, comprising: a positioning module configured to operate on the basis of the oscillator signal.

16. The electronic device according to claim 15, wherein the positioning module is configured to evaluate at least one parameter of the oscillator signal from a position fix obtained on the basis of the oscillator signal.

17. The electronic device according to claim 15, comprising: a mobile communication module.

18. The electronic device according to claim 17, wherein the positioning module is configured to evaluate at least one parameter of the oscillator signal on the basis of a comparison of the oscillator signal to a synchronized oscillator signal received from the mobile communication module.

19. An electronic circuit, comprising:
an oscillator element comprising an oscillator crystal and a temperature sensor,
an oscillator circuit coupled to the oscillator crystal,
a measurement controller coupled to the temperature sensor so as to receive a temperature signal and configured to measure a first value of the temperature signal at a first point of time and a second value of the temperature signal at a second point of time,
a frequency drift estimator configured to estimate a frequency drift of the oscillator signal on the basis of the first value of the temperature signal and the second value of the temperature signal, and
a compensation logic configured to generate a frequency compensation signal for the oscillator circuit on the basis of the estimated frequency drift.

20. The electronic circuit according to claim 19, wherein the oscillator circuit, the measurement controller, the frequency drift estimator, and the compensation logic are part of an electronic device which is spaced apart from the oscillator element.

21. A method, comprising:
generating an oscillator signal by means of an oscillator circuit coupled to an oscillator crystal,
obtaining a temperature signal representing the temperature of the oscillator crystal,
measuring a first value of the temperature signal at a first point of time and a second value of the temperature signal at a second point of time,
estimating a frequency drift of the oscillator signal on the basis of the first value of the temperature signal and the second value of the temperature signal, and
generating a frequency compensation signal for the oscillator circuit on the basis of the estimated frequency drift.

22. The method according to claim 21, comprising: estimating the frequency drift on the basis of a difference between the first value of the temperature signal and the second value of the temperature signal.

23. The method according to claim 21, comprising: estimating the frequency drift on the basis of a difference between a first frequency value corresponding to the first value of the temperature signal and a second frequency value corresponding to the second value of the temperature signal.

24. The method according to claim 21, comprising: estimating a frequency error of the oscillator signal on the basis of the first value of the temperature signal and/or the second value of the temperature signal.

25. The method according to claim 24, comprising: generating the frequency compensation signal on the basis of the estimated frequency error.

* * * * *